United States Patent
Park

(10) Patent No.: US 7,417,912 B2
(45) Date of Patent: Aug. 26, 2008

(54) BIT-LINE SENSE AMPLIFIER DRIVER

(75) Inventor: Mun-Phil Park, Gyeonggi-do (KR)

(73) Assignee: Hynix Semiconductor Inc. (KR)

( * ) Notice: Subject to any disclaimer, the term of this patent is extended or adjusted under 35 U.S.C. 154(b) by 15 days.

(21) Appl. No.: 11/585,096

(22) Filed: Oct. 24, 2006

(65) Prior Publication Data

US 2007/0104008 A1    May 10, 2007

(30) Foreign Application Priority Data

Nov. 9, 2005    (KR) .................. 10-2005-0106956

(51) Int. Cl.
*G11C 7/00* (2006.01)
(52) U.S. Cl. ............... 365/222; 365/205; 365/230.06
(58) Field of Classification Search ............ 365/203, 365/205, 222, 230.06; 327/51, 53
See application file for complete search history.

(56) References Cited

U.S. PATENT DOCUMENTS

| | | | |
|---|---|---|---|
| 6,043,685 A | 3/2000 | Lee | |
| 6,344,760 B1* | 2/2002 | Pyo | ................ 327/51 |
| 6,477,100 B2 | 11/2002 | Takemura et al. | |
| 6,944,078 B2 | 9/2005 | Takemura et al. | |
| 7,020,043 B1* | 3/2006 | Lee | ............... 365/230.06 |
| 7,184,342 B2* | 2/2007 | Seo | ............... 365/203 |

FOREIGN PATENT DOCUMENTS

| | | |
|---|---|---|
| JP | 2001222888 | 8/2001 |
| JP | 2002358778 | 12/2002 |
| JP | 2003068073 | 3/2003 |
| JP | 2003228981 | 8/2003 |
| JP | 2003257181 | 12/2003 |
| KR | 1020040092772 A | 11/2004 |
| KR | 1020050059790 A | 6/2005 |

* cited by examiner

*Primary Examiner*—Gene N. Auduong
(74) *Attorney, Agent, or Firm*—Venable LLP; Jeffri A. Kaminski

(57) ABSTRACT

In a memory device that operates at high speed, a bit-line sense amplifier driver is provided to overdrive a sense amplifier in a refresh mode. A bit-line sense amplifier driver includes a refresh overdriving control unit that is coupled to an external power supply terminal and a sense amplifier power line signal output terminal, and driven by a refresh flag signal and a sense amplifier power line enable signal to apply an external supply voltage to the sense amplifier power line signal output terminal in a refresh mode.

Therefore, it is possible to prevent a driving voltage from serving as noise, which hinders the high speed operation of the memory device.

21 Claims, 6 Drawing Sheets

BIT-LINE SENSE AMPLIFIER DRIVER

BACKGROUND

1. Technical Field

The present invention relates to a bit-line sense amplifier driver, in particular, to a bit-line sense amplifier driver which overdrives a sense amplifier in a high speed operation memory device in a refresh mode.

2. Related Art

The data processing speed of graphics memory devices such as GDDR4 and next-generation general purpose memory devices such as DDR2 or DDR3 are being improved, which is attributable to higher operational frequencies. Therefore, stabilizing operation voltages in a high speed operation is becoming an issue. Further, the above memory devices are susceptible to noises caused by the operating power supply such that the operational characteristics are determined by the noise in the power supply. Accordingly, stabilizing the internal power supply is becoming more important.

In order to drive a sense amplifier which activates bit-line and bit-line bar nodes, memory devices generally use an overdriving method that abruptly applies an external supply voltage VDD to a sense amplifier driver which uses an internal supply voltage VCORE of the memory device in an active mode.

FIGS. 1 and 2 are views showing a bit-line sense amplifier used generally.

When a bit-line equalizing signal BLEQ is at a high level, N-type-transistors 102, 104, 106 are turned on and a voltage between a sense amplifier power line, i.e. RTO signal input line and a sense amplifier ground line, i.e. SB signal input line serves as a first voltage VBLP. Thereafter, when an active command is enabled to make the BLEQ signal reach a low level, and a word line selection signal is enabled, charge sharing is commenced in a bit-line pair, e.g. BL and BLb.

Bit-line sensing refers to sensing the amount of charge shared in the bit-line pair of a memory cell. For that purpose, the voltage applied to the bit-line pair BL and BLb must be amplified. Therefore, in order to activate enable signals SAP and SAN of the bit-line sense amplifier driver, a first enable signal SAP is pulled low, and a second enable signal SAN is pulled high.

Accordingly, a P-type transistor 108 and an N-type transistor 110 are individually turned on so that a voltage level of the sense amplifier power line shifts from the first voltage VBLP to a second voltage of the internal supply voltage VCORE. Furthermore, a voltage applied to the sense amplifier ground line SB shifts from a first voltage to a ground voltage VSS.

Voltages applied to the sense amplifier power line RTO and the sense amplifier ground line SB serve as a power source of the sense amplifier to sense the amount of charge by amplifying the voltage level of the bit-line pair BL and BLb which start to perform the charge sharing. In this case, when the difference between the voltage levels of the bit-line pair BL and BLb exceeds a predetermined value, the charge sensing is performed accurately. Therefore, by enabling an overdriving control signal OVD, the external supply voltage VDD is applied to the sense amplifier power line via a P-type transistor 100 or 200.

In this case, the P-type transistor 100 or 200 which is driven by the overdriving control signal OVD may be coupled to the terminal of the external power supply voltage VDD and the terminal of the sense amplifier power line output voltage RTO (see FIG. 1) or between the terminal of the external power supply voltage VDD and the terminal of the internal power supply voltage VCORE (see FIG. 2).

In a high speed operation memory device, however, it is important to maintain a stable supply voltage. A problem of the above method is that the performance of the memory device is adversely affected because the driving supply voltage serves as noise during overdriving. The stable operation of the memory device is further hindered due to rising of the internal supply voltage VCORE caused by overdriving. That is to say, the external power supply VDD is abruptly consumed in the memory device during the overdriving, which causes the potential of the external power supply VDD to become unstable due to a large application current. Accordingly, the unstable external power supply VDD may result in malfunction or operational error of the memory device that is sensitive to the driving voltage fluctuation.

A length of a column address of the high speed operation memory device is not significant, and due to the development of elements and processing technology, the overdriving operation is not required because, in a normal mode where banks are independently activated, the operation speed is not adversely affected even when the overdriving is not performed. But, in the refresh mode, all banks of the memory device must be activated, which weakens the internal power supply voltage. Therefore, in the refresh mode, the overdriving must be performed to ensure satisfactory restoration of the memory cells.

SUMMARY

Accordingly, it is an object of the present invention to provide a bit-line sense amplifier driver in which overdriving is performed only in a refresh mode, but not in a normal mode of a high speed operation semiconductor memory device so as to reduce noise caused by the driving supply voltage.

According to an aspect of the invention, a bit-line sense amplifier driver includes a refresh overdriving control unit that is coupled to an external power supply terminal and a sense amplifier power line signal output terminal, and driven by a refresh flag signal and a sense amplifier power line enable signal to apply an external supply voltage to the sense amplifier power line signal output terminal in a refresh mode.

According to another aspect of the invention, a bit-line sense amplifier driver includes a refresh overdriving control unit that is coupled to an external power supply terminal and an internal supply voltage input terminal and driven by a refresh flag signal and a sense amplifier power line enable signal to apply an external supply voltage to the internal supply voltage input terminal in a refresh mode.

According to still another aspect of the invention, a bit-line sense amplifier driver includes a refresh overdriving control unit that applies an external supply voltage to the sense amplifier power line signal output terminal in response to a refresh flag, signal and a sense amplifier power line enable signal in a refresh mode.

DESCRIPTION OF EXEMPLARY EMBODIMENTS

Now, exemplary embodiments of the invention will be described in detail with reference to the accompanying drawings.

Figure 1:
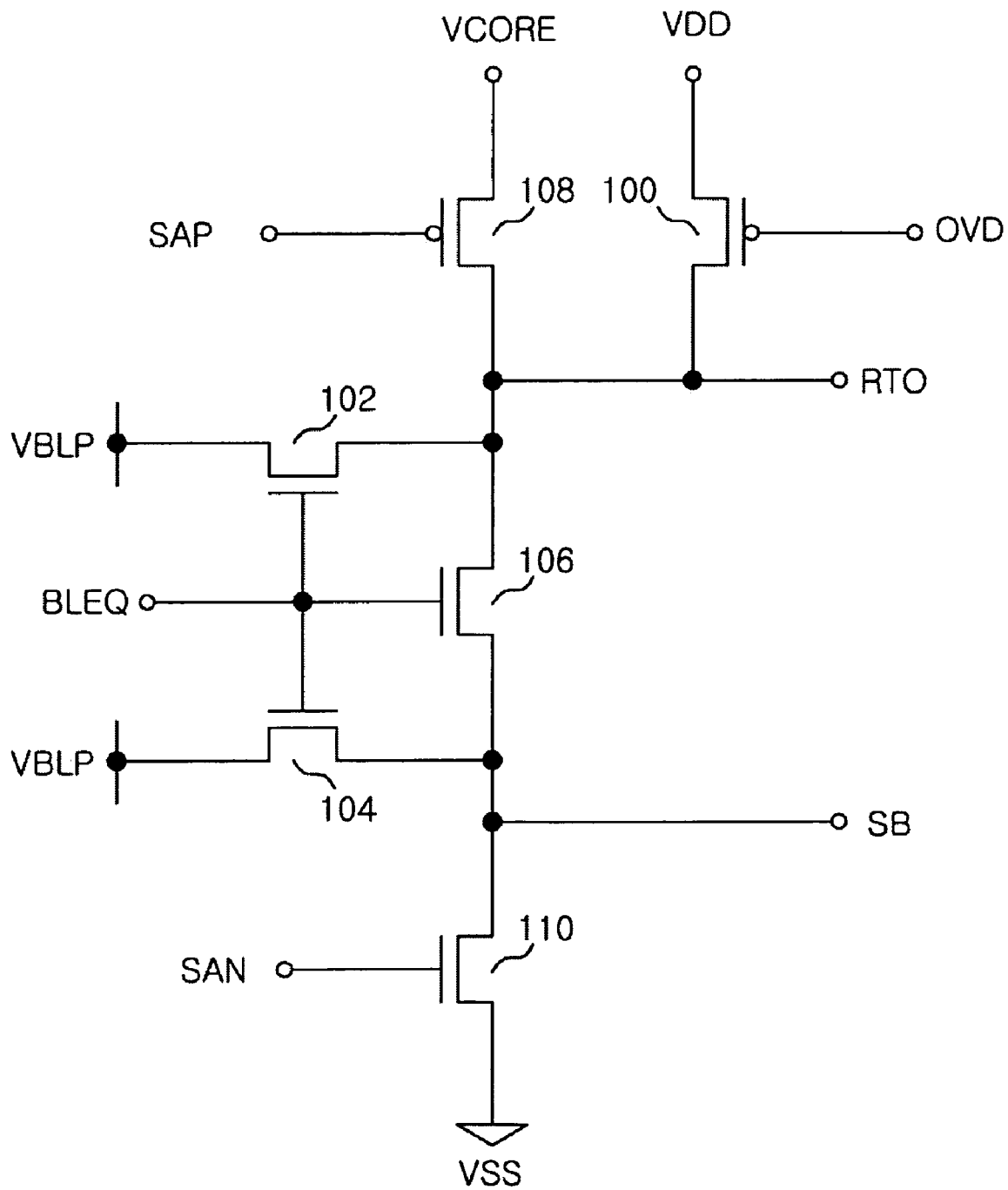
FIG. 1 is a circuit diagram of a bit-line sense amplifier driver used generally.
Figure 2:
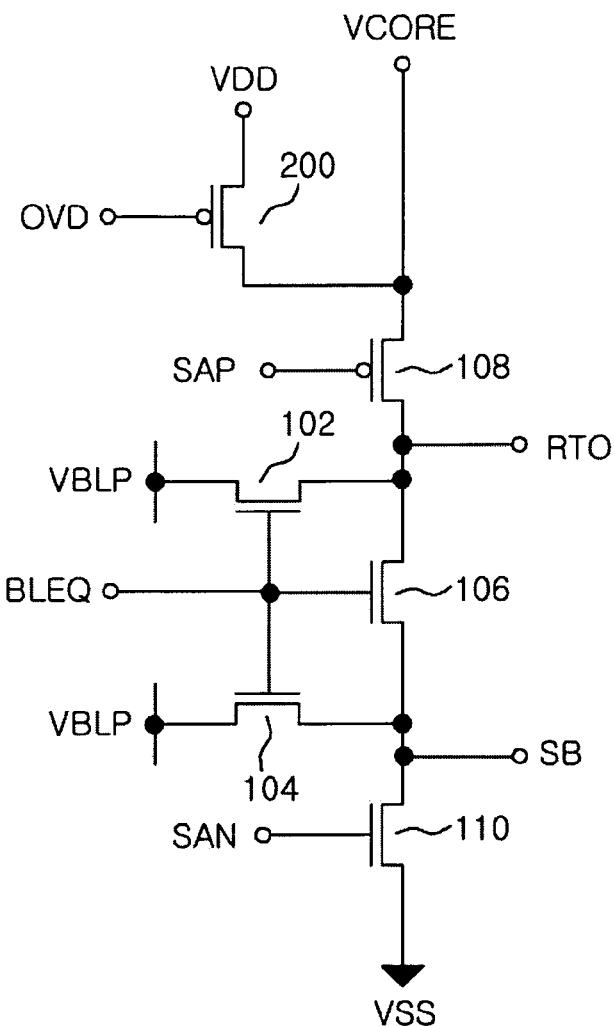
FIG. 2 is a circuit diagram of another bit-line sense amplifier driver used generally.
Figure 3:
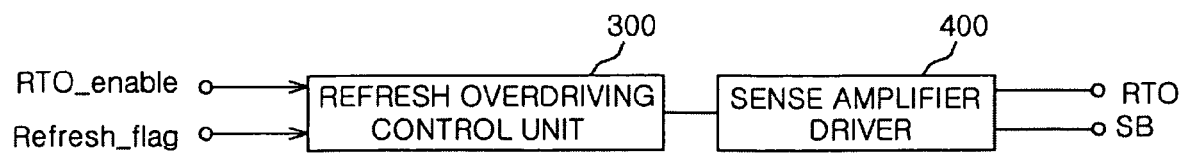
FIG. 3 is a block diagram of a bit-line sense amplifier driver according to an embodiment of the invention.

FIG. 3 is a block diagram of a bit-line sense amplifier driver according to an embodiment of the invention.

Referring to FIG. 3, the bit-line sense amplifier driver includes a refresh overdriving control unit 300 and a sense amplifier driver 400. The refresh overdriving control unit 300 is driven by a sense amplifier power line enable signal RTO_enable and a refresh flag signal Refresh_flag to apply an external supply voltage to a sense amplifier power line signal output terminal in a refresh mode. The sense amplifier driver 400 is connected to the refresh overdriving control unit 300 and outputs a sense amplifier power line signal RTO and a sense amplifier ground line signal SB to drive a sense amplifier.

Figure 4:
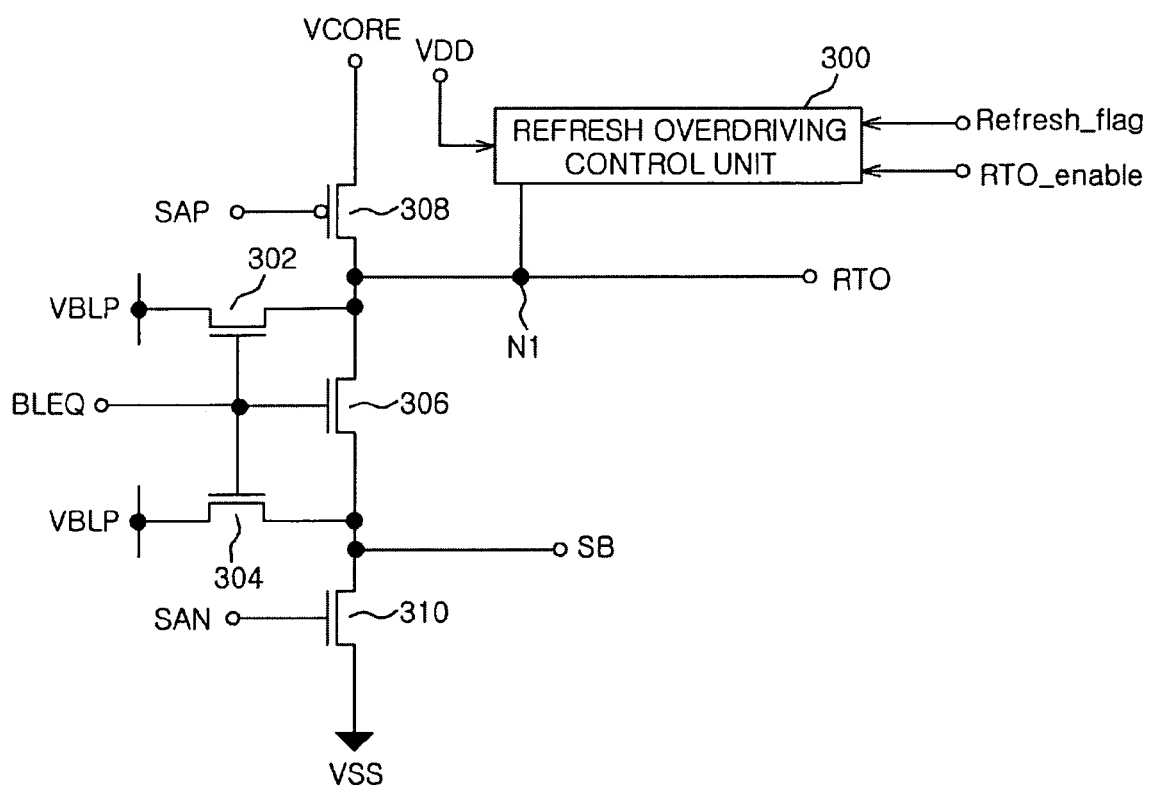
FIG. 4 is a circuit diagram of the bit-line sense amplifier driver shown in FIG. 3.
Figure 5:
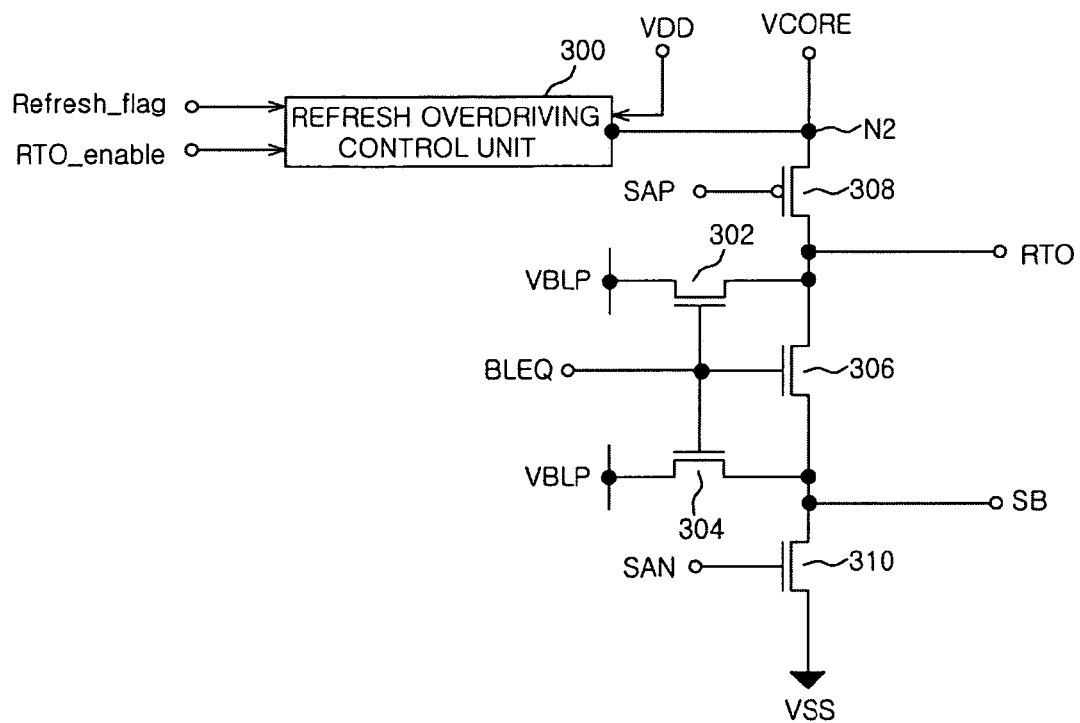
FIG. 5 is a circuit diagram of a bit-line sense amplifier driver according to another embodiment of the invention.

FIG. 4 is a circuit diagram of the bit-line sense amplifier driver according to the embodiment of the invention. FIG. 5 is a circuit diagram of a bit-line sense amplifier driver according to another embodiment of the invention.

In the embodiment of the invention, as shown in FIG. 4, the bit-line sense amplifier driver is coupled to a terminal of the external power supply VDD and a sense amplifier power line signal output terminal N1. The bit-line sense amplifier driver also includes the refresh overdriving control unit 300 which is driven by the refresh flag signal Refresh_flag and the sense amplifier power line enable signal RTO_enable.

In another embodiment of the invention, the refresh overdriving control unit 300 may be coupled to the external power supply terminal and an internal supply voltage input terminal N2 as shown in FIG. 5.

More specifically, the sense amplifier driver according to the embodiment of the invention includes a first P-type transistor 308 that is coupled to an internal supply voltage input terminal N2 and the sense amplifier power line signal output terminal N1 to be driven by a first enable signal SAP; a first N-type transistor 302 that is coupled to the sense amplifier power line signal output terminal N1 and a bit-line precharge voltage supply terminal VBLP to be driven by a bit-line equalizing signal BLEQ; a second N-type transistor 304 that is coupled to the terminal of the sense amplifier ground line signal output SB and the bit-line precharge voltage supply terminal VBLP to be driven by the bit-line equalizing signal BLEQ; a third N-type transistor 306 that is coupled to the sense amplifier power line signal output terminal N1 and the sense amplifier ground line signal output terminal to be driven by the bit-line equalizing signal BLEQ; a fourth N-type transistor 310 that is coupled to the sense amplifier ground line signal output terminal and the ground terminal VSS to be driven by a second enable signal SAN, and the refresh overdriving control unit 300.

Since the sense amplifier driver configured as mentioned above is driven by the first enable signal SAP which uses the internal power supply in the normal mode, the external power supply can be stabilized. Furthermore, the drop in the internal supply voltage, caused by overdriving in the refresh mode where all of the banks of the memory device are activated, can be suppressed.

The embodiment of FIG. 5 has a further advantage in the bank layout in that it obviates the addition of the overdriving control unit to each sub hole of the banks if the refresh overdriving control unit 300 is directly connected to the internal power supply input terminal.

The configurations of the sense amplifier driver, however, are not limited to those shown in FIGS. 4 and 5. Any other configurations to drive the sense amplifier may be employed. Alternately, the refresh overdriving control unit 300 according to the embodiment of the invention may be connected thereto.

Figure 6:
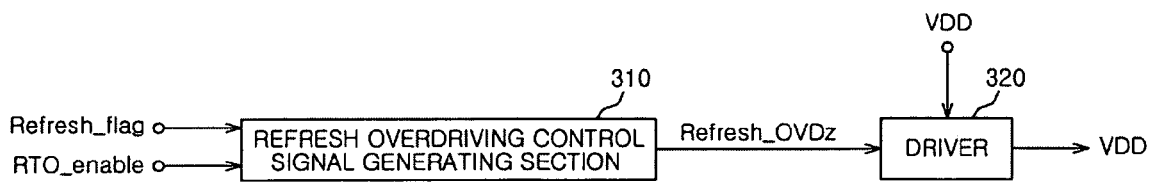
FIG. 6 is a detailed block diagram of a refresh overdriving control unit shown in FIGS. 4 and 5.

FIG. 6 is a detailed block diagram of the refresh overdriving control unit shown in FIGS. 4 and 5.

Referring to FIG. 6, the refresh overdriving control unit 300 includes a control signal generating section 310 which generates a refresh overdriving control signal Refresh_OVDz in response to the refresh flag signal Refresh_flag and the sense amplifier power line enable signal RTO_enable and a driver 320 that supplies an external supply voltage VDD to the sense amplifier driver in response to the refresh overdriving control signal Refresh_OVDz.

Since the level of the refresh flag signal Refresh_flag is low in a normal mode, and shifts to a high level in response to input of a refresh command, the sense a amplifier driver is overdriven only in the refresh mode, but not in the normal mode.

Therefore, using the above-mentioned refresh overdriving control unit to overdrive the sense amplifier in the refresh mode but not in the normal mode minimizes adverse effects during the high speed operation. This is because the refresh mode does not accompany normal operations such as reading or writing. Rather, the refresh mode merely restores the memory cells. During the refresh mode, all banks in the memory device are activated, thus, the driving voltage does not serve as noise even when the external voltage is abruptly applied.

Figure 7:
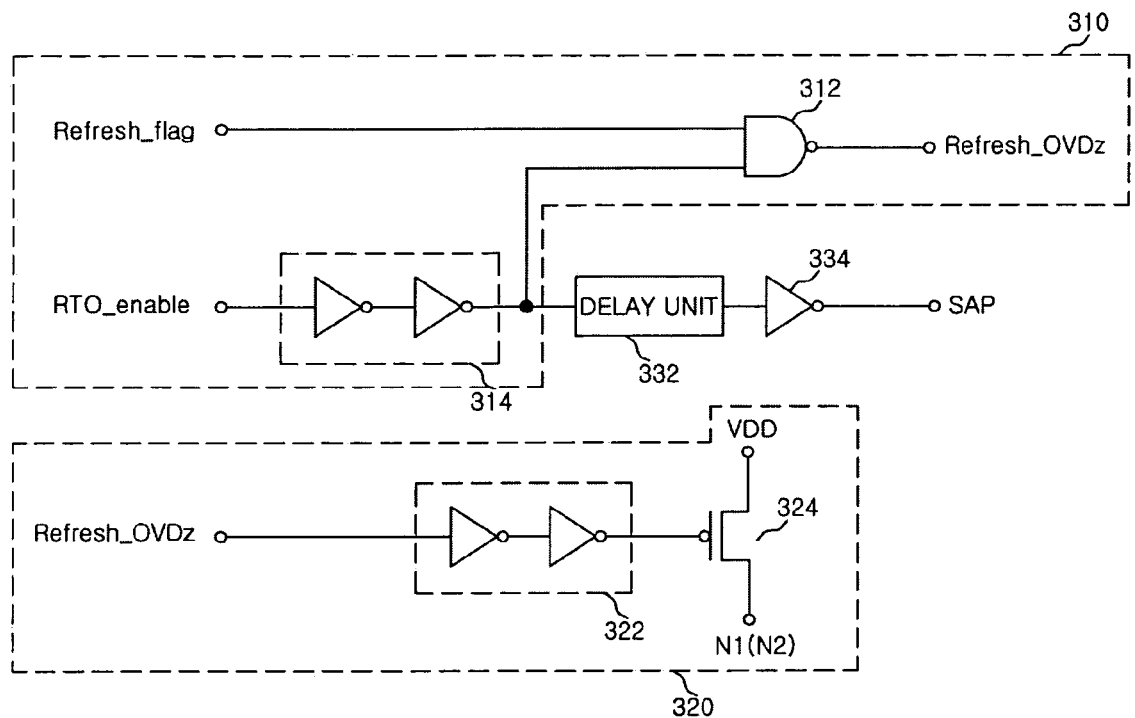
FIG. 7 is a detailed-circuit diagram of the refresh overdriving control unit shown in FIG. 6.

FIG. 7 is a detailed circuit diagram of the refresh overdriving control unit shown in FIG. 6.

Referring to FIG. 7, the refresh overdriving control signal generating unit 310 has a logic element 312. The refresh flag signal Refresh_flag and the sense amplifier power line enable signal RTO_enable are inputted to a logic element 312. This causes the logic element 312 to output a refresh overdriving control signal Refresh_OVDz. Here, the sense amplifier power line enable signal RTO_enable is delayed by a predetermined amount of time by a first delay unit 314 and then inputted to the logic element 312.

With this configuration, a pulse width of the refresh overdriving control signal Refresh_OVDz can be controlled for a desired overdriving timing by controlling a delay timing of the first delay unit 314.

The refresh flag signal Refresh_flag becomes low level in the normal mode, and shifts to high level when the refresh command is input. Furthermore, the sense amplifier power line enable signal RTO_enable is activated as a high level signal when an active command and the refresh command are inputted. Accordingly, both input signals Refresh_flag and RTO_enable become high level in response to the refresh command to activate the refresh overdriving control signal Refresh_OVDz as a low level.

A driver 320 includes a switching element 324 connected to the external power supply terminal and the sense amplifier power line signal output terminal N1 or the internal supply voltage input terminal N2. The switching element 324 is driven by the refresh overdriving control signal Refresh_OVDz. In this case, the refresh overdriving control signal Refresh_OVDz is delayed by a predetermined amount of time by a second delay unit 322 and then drives the switching element 324.

When the refresh overdriving control signal Refresh_OVDz is activated by the refresh overdriving control signal generating unit 310, the switching element 324 is turned on so that the external supply voltage VDD is applied to the sense-amplifier power line signal output terminal N1 or the internal supply voltage input terminal N2 for a predetermined amount of time in the refresh mode.

Here, the switching element 324 may be implemented by an MOS transistor such as a P-type transistor or an N-type transistor. Particularly, when the switching element 324 is implemented by the N-type transistor, the potential of the refresh overdriving control signal Refresh_OVDz is preferably controlled so as to be greater than the sum of the external supply voltage VDD and a breakdown voltage of the N-type transistor.

In this embodiment, a first, enable signal SAP is preferably generated by delaying the sense amplifier power line enable signal RTO_enable using the first delay unit 314 and a third delay unit 332 and then inverting the delayed signal with an inverter 334. By adding the third, delay unit 332, the switching element 324 is turned on in response to the refresh overdriving control signal Refresh_OVDz before the sense amplifier is enabled and the external voltage is charged to the sense amplifier power line signal output terminal N1 or the internal supply voltage input terminal N2. As a result, it is possible to efficiently perform an overdriving operation.

Figure 8:
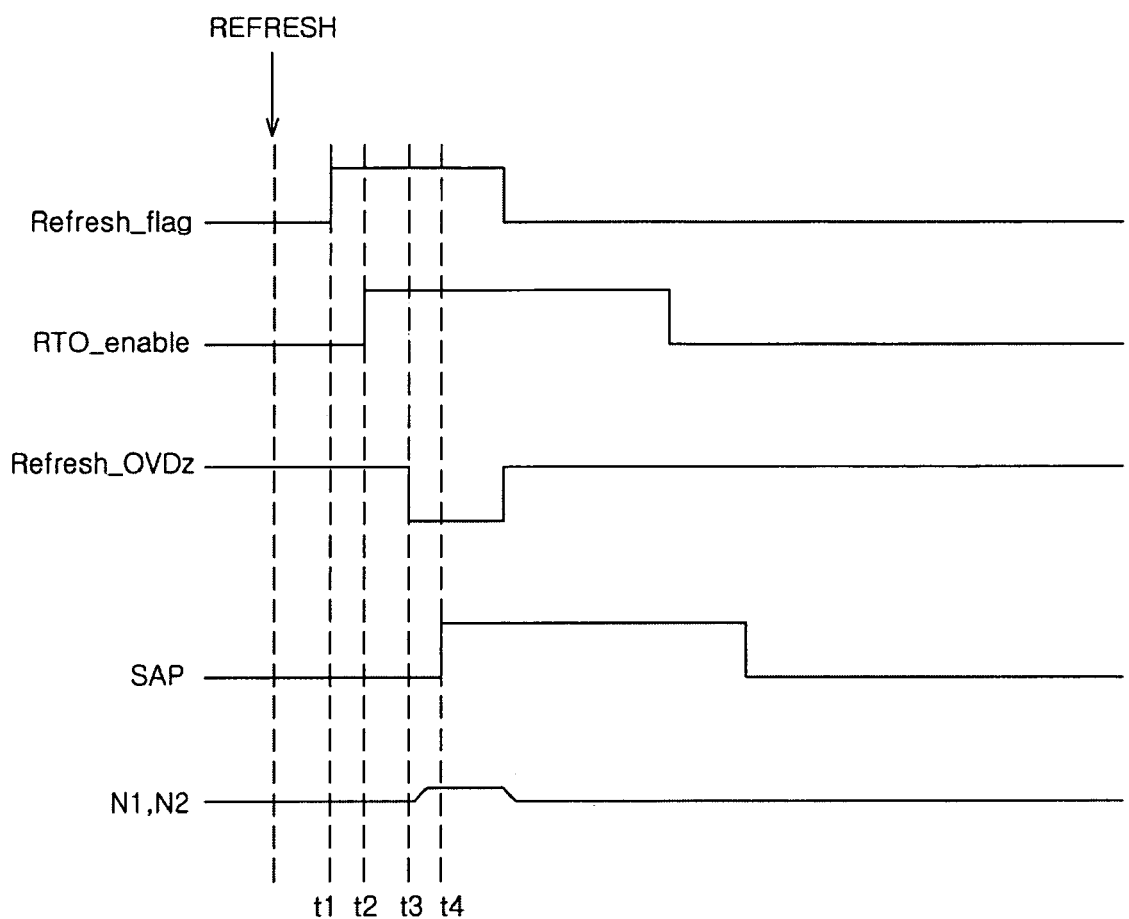
FIG. 8 is a timing chart illustrating a refresh overdriving operation using the bit-line sense amplifier driver according to an embodiment of the invention.

FIG. 8 is a timing chart illustrating the refresh overdriving operation using the bit-line sense amplifier driver according to the embodiment of the invention.

As shown in FIG. 8, in response to input of the refresh command, the refresh flag signal. Refresh_flag is enabled at a time t1, and then the sense amplifier power line enable signal RTO_enable is enabled at a time t2 which is several nano seconds later than the time t1.

Thereafter, the refresh flag signal Refresh flag and the delayed sense amplifier power line enable signal RTO_enable are inputted to the logic element 312 to output the refresh overdriving control signal Refresh_OVDz at a time t3. The switching element is driven by the refresh overdriving control signal Refresh_OVDz to raise the voltage of the sense amplifier power line signal output terminal N1 or the internal supply voltage input terminal N2.

Furthermore, the first enable signal SAP is outputted at a time t4, which allows the sense amplifier to operate in response to the first enable signal SAP after charging the external supply voltage to the sense amplifier power line signal output terminal N1 or the internal supply voltage input terminal N2.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative but illustrative in all aspects. In addition, the scope of the present invention is defined by the appended claims rather than by the above exemplary embodiments, and all changes that fall within the metes and bounds of the claims, or equivalents of such metes and bounds are therefore intended to be embraced by the claims.

According to the above-described embodiment of the invention, the overdriving is performed in the refresh mode where a large current is consumed, but not in the normal mode. As a result, it is possible to prevent a driving voltage from serving as noise, which hinders the high speed operation of the memory device. It is further possible to supply the internal supply voltage in a stable manner, and to improve the performance of the memory device by preventing the rise of the voltage of the internal power supply due to the overdriving.

What is claimed is:

1. A bit-line sense amplifier driver comprising:
a refresh overdriving control unit configured to provide an external supply voltage for an overdriving operation to a sense amplifier power line signal output terminal in response to a refresh flag signal and a sense amplifier power line enable signal in a refresh mode, and provide an internal supply voltage for a normal operation to the sense amplifier power line signal output terminal in response to the refresh flag signal and the sense amplifier power line enable signal in a normal mode;
wherein the refresh overdriving control unit is coupled in an external power supply terminal and the sense amplifier power line signal output terminal.

2. The bit-line sense amplifier driver of claim 1,
wherein the refresh overdriving control unit includes:
a refresh overdriving control signal generating section that outputs a refresh overdriving control signal with a predetermined pulse width in response to the refresh flag signal and the sense amplifier power line enable signal; and
a driver that applies the external supply voltage to the sense amplifier power line signal output terminal in response to an output signal from the refresh overdriving control signal generating section.

3. The bit-line sense amplifier driver claim 2,
wherein the refresh overdriving control signal generating section includes a logic element having the refresh flag signal and the sense amplifier power line enable signal as input signals, and the refresh overdriving control signal having a predetermined pulse width as an output signal.

4. The bit-line sense amplifier driver of claim 3,
wherein the logic element is a NAND gate.

5. The bit-line sense amplifier driver of claim 3,
wherein the refresh overdriving control signal generating section further includes a first delay unit which delays the sense amplifier power line enable signal by a predetermined amount of time, and outputs the delayed the sense amplifier power line enable signal to the logic element.

6. The bit-line sense amplifier driver of claim 2,
wherein the driver has a switching element which is connected to the external power supply terminal and the sense amplifier power line signal output terminal to be driven by the refresh overdriving control signal.

7. The bit-line sense amplifier driver of claim 6,
wherein the switching element is a MOS transistor.

8. The bit-line sense amplifier driver of claim 6,
wherein the driver further has a delay unit which delays the refresh overdriving control signal by a predetermined amount of time to output a signal for driving the switching element.

9. The bit-line sense amplifier driver of claim 5, further comprising:
a second delay unit which delays a signal output from the first delay unit by a predetermined amount of time to output an enable signal SAP.

10. A bit-line sense amplifier driver comprising:

a refresh overdriving control unit configured to provide an external supply voltage for an overdriving operation to an internal supply voltage input terminal in response to a refresh flag signal and a sense amplifier power line enable signal in a refresh mode, and provide an internal supply voltage for a normal operation to the internal supply voltage input terminal in response to the refresh flag signal and the sense amplifier power line enable signal in a normal mode;

wherein the refresh overdriving control unit is coupled to an external power supply terminal and the internal supply voltage input terminal.

11. The bit-line sense amplifier driver of claim 10, wherein the refresh overdriving control unit includes:

a refresh overdriving control signal generating section that outputs a refresh overdriving control signal with a predetermined pulse width in response to the refresh flag signal and the sense amplifier power line enable signal; and a driver that applies the external supply voltage to the sense amplifier power line signal output terminal in response to an output signal from the refresh overdriving control signal generating section.

12. The bit-line sense amplifier driver of claim 11, wherein the refresh overdriving control signal generating section includes a logic element having the refresh flag signal and the sense amplifier power line enable signal as input signals, and the refresh overdriving control signal with a predetermined pulse width as an output signal.

13. The bit-line sense amplifier driver of claim 12, wherein the logic element is a NAND gate.

14. The bit-line sense amplifier driver of claim 12, wherein the refresh overdriving control signal generating section further includes a first delay unit which delays the sense amplifier power line enable signal by a predetermined amount of time, and outputs the delayed the sense amplifier power line enable signal to the logic element.

15. The bit-line sense amplifier driver of claim 11, wherein the driver has a switching element which is connected to the external power supply terminal and the sense amplifier power line signal output terminal to be driven by the delayed refresh overdriving control signal.

16. The bit-line sense amplifier driver of claim 15, wherein the switching element is a MOS transistor.

17. The bit-line sense amplifier driver of claim 15, wherein the driver further has a second delay unit which delays the refresh overdriving control signal by a predetermined amount of time to output a signal for driving the switching element.

18. The bit-line sense amplifier driver of claim 14, further comprising:

a second delay unit which delays a signal output from the first delay unit by a predetermined amount of time to output an enable signal SAP.

19. A bit-line sense amplifier driver comprising:

a refresh overdriving control unit configured to provide an external supply voltage for an overdriving operation to a sense amplifier power line signal output terminal in response to a refresh flag signal and a sense amplifier power line enable signal in a refresh mode and provide an internal power supply voltage for a normal operation to the sense amplifier power line signal output terminal in response to the refresh flag signal and the sense amplifier power line enable signal in a normal mode;

wherein the refresh overdriving control unit includes:

a refresh overdriving control signal generating section that outputs a refresh overdriving control signal with a predetermined pulse width by operating the refresh flag signal and the sense amplifier power line enable signal; and a driver that applies the external supply voltage to the sense amplifier power line signal output terminal in response to an output signal from the refresh overdriving control signal generating section.

20. The bit-line amplifier driver of claim 19, wherein the refresh overdriving control unit is coupled to the external power supply terminal and the sense amplifier power line signal output terminal.

21. The bit-line amplifier driver of claim 19, wherein the refresh overdriving control unit is coupled to the external power supply terminal and an internal supply voltage input terminal.

* * * * *